United States Patent [19]
Yoo et al.

[11] Patent Number: 5,798,969
[45] Date of Patent: Aug. 25, 1998

[54] DATA OUTPUT BUFFER CONTROL CIRCUIT OF A SYNCHRONOUS SEMICONDUCTOR MEMORY DEVICE

[75] Inventors: Hak-Soo Yoo, Seoul; Jong-Hak Won, Suwon, both of Rep. of Korea

[73] Assignee: Samsung Electronics Co., Ltd., Suwon, Rep. of Korea

[21] Appl. No.: 770,784

[22] Filed: Dec. 20, 1996

[30] Foreign Application Priority Data

Dec. 22, 1995 [KR] Rep. of Korea ............... 1995/54749

[51] Int. Cl.$^6$ ............................................... G11C 7/00
[52] U.S. Cl. .................. 365/189.05; 365/233; 326/57; 326/83
[58] Field of Search .................. 365/189.05, 233, 365/190; 326/27, 28, 57, 62, 83

[56] References Cited

U.S. PATENT DOCUMENTS

| 5,384,735 | 1/1995 | Park et al. ............ | 365/189.05 |
|---|---|---|---|
| 5,384,750 | 1/1995 | Lee ......................... | 365/233 |
| 5,535,171 | 7/1996 | Kim et al. ............... | 365/233 |

*Primary Examiner*—Son T. Dinh
*Assistant Examiner*—Son Mai
*Attorney, Agent, or Firm*—Marger, Johnson, McCollom & Stolowitz, P.C.

[57] ABSTRACT

A method of controlling the buffering of output data by synchronizing with an external system clock, including the steps of generating an internal clock pulse, transferring data from a chip to a pair of data output lines in response to the internal clock pulse, generating an output mode control signal in synchronism with the internal clock pulse, gating the output mode control signal from the first edge of the internal clock pulse to the first edge of the next internal clock pulse to produce an output control signal, and driving data output to an output pad in response to the output control signal is disclosed. A data output buffer control apparatus of a synchronous semiconductor memory device operating in synchronism with an externally applied system clock pulse is also disclosed, which apparatus has an internal clock pulse generator for generating an internal clock pulse in response to the system clock pulse, an output register for transmitting data from the inside of the chip to a pair of data output lines in synchronism with the first edge of the system clock pulse, an output mode control signal generator for generating a predetermined output mode control signal in synchronism with the system clock pulse, an output buffer control means for gating the output mode control signal from the first edge to the second edge of an internal clock pulse to create an output control signal, and a data output means for driving the output of the output register in response to the output control signal of the output buffer control means.

8 Claims, 8 Drawing Sheets

DATA OUTPUT BUFFER CONTROL CIRCUIT OF A SYNCHRONOUS SEMICONDUCTOR MEMORY DEVICE

BACKGROUND OF THE INVENTION

1. Field of the Invention

The present invention relates to a means and apparatus for data output buffer control of a synchronous semiconductor memory device, and more particularly to data output buffer control achieved by synchronizing with an external system clock.

2. Description of the Related Art

A semiconductor memory device usually comprises a data output buffer for retrieving data from the internal memory cells. A conventional data output buffer of a dynamic RAM pulls up data to the level of a CMOS and then transfers the data to the output pad of a chip, which is well known in the prior art. According to the prior art, a data output buffer control apparatus of a semiconductor memory device for achieving a high-speed data access time is typically designed to control the data output according to the system clock pulse CLK.

Referring to FIGS. 1 and 2, showing the data output buffer control apparatus of the prior art, within the data output buffer 20, the data signals of a pair of data lines DIO/DIOB and the output control signal PIDOC are controlled by the internal clock pulse PICLK. With further reference to FIG. 3, for illustration of the operational timing pulses and data transfer operations of the prior art data output buffer control apparatus; when an external system clock pulse CLK is applied to the apparatus, an internal clock pulse generator 12 detects the rising edge of the external pulse CLK to generate an internal clock pulse PICLK of a specified duration. The internal clock pulse PICLK is then applied to an output register 14 and a data output buffer 20; the output buffer 20 being additionally connected to a data line pair DIO/DIOB from the output register 14, an output node of an output buffer control circuit 18 and an output pad. In operation, the output register 14 transfers an output data signal to the output line pair DIO/DIOB in response to the internal clock pulse PICLK. At this moment, an output mode control circuit 16 generates an output mode signal OUTMODE in a logically high state. The output buffer control circuit 18 generates an output control signal PIDOC in a logically highstate, which, in turn, controls the output buffer 20.

The transmitting gates 22, 24, and 26, within the output buffer 20, respond to the internal clock pulse PICLK and transmit the signals from the data line pair DIO/DIOB and the output control signal PIDOC, received from the output node of the output buffer control circuit 18, to the corresponding buffers 30, 32, and 34 respectively. Namely, the output buffer 20 receives the output control signal PIDOC and the data transferred from the data line pair DIO/DIOB by synchronizing with the internal clock pulse, thereby determining the output data of the data output line pair DO/DOB. Specifically, to determine the output data line pair DO/DOB, the input data signals DIO/DIOB and PIDOC are transferred to buffers 30, 32, and 34, respectively, by synchronizing with the internal clock pulse PICLK (using NMOS and PMOS trasistors gated to the internal clock pulse PICLK, as shown in FIG. 2). The NAND gate 36 logically combines the output control signal PIDOC of the buffer 34 with the data signal DO delivered from the buffer 30. The NAND gate 38 logically combines the output control signal PIDOC with the data signal DOB delivered from the buffer 32. The resulting signals from NAND gates 36 and 38 pass through their respective inverters 40 and 42 and are subsequently supplied to the gates of the pull-up and pull-down NMOS transistors 44 and 46, respectively. Accordingly, when the signals from the data line pair DIO/DIOB of the output register 14 are transferred to the output buffer 20 by the internal clock pulse PICLK, the pull-up and pull-down NMOS transistors 44 and 46 are operated exclusively of each other, and the resulting data is thereby delivered to the output pad as signal DOUT.

However, as indicated above, the logic of the output control signal PIDOC generated by the output buffer control circuit 18 is determined and transmitted before controlling the output buffer 20, and the output cycle of the data transferred from the data line pair DIO/DIOB of the output register 14 by the internal clock pulse PICLK becomes equal to the output cycle of the output buffer 20. The transition of the data level transmitted from the output buffer 20 therefore becomes equal to the transition of input data signal. Consequently, the conventional data output control of a synchronized semiconductor memory device has the drawbacks that it cannot transfer data in high speed and suffers from interference which gives rise to serious noise problems. An additional problem with conventional data output buffer control devices is that the output cycle of the data output buffer cannot be controlled because the conventional circuit generates output data having the same duration as the input data delivered to the output buffer.

SUMMARY OF THE INVENTION

It is, therefore, an object of the present invention to enable a data output buffer control apparatus of a synchronous semiconductor memory device to operate in synchronism with an externally supplied system clock pulse to produce high speed data transfer.

It is another object of the present invention to enable a data output buffer control apparatus that allows changing of the output cycle of the output buffer of a synchronous semiconductor memory device, thereby enabling control of the duration of the output cycle.

According to the present invention, a data output buffer control apparatus of a synchronous semiconductor memory device operating in synchronism with an externally applied system clock pulse comprises an output register for transmitting data from the inside of the chip to a pair of data output lines in synchronism with the first edge of the system clock pulse, an output mode control signal generator for generating a predetermined output mode control signal in synchronism with said system clock pulse, an output buffer control means for gating said output mode control signal from the first edge to the second edge of said internal clock pulse, and a data output means for driving the output of said output register in response to the output signals of said output buffer control means.

The present invention will now be described more specifically with reference to the drawings attached, the description being by way of example only and not of limitation.

DETAILED DESCRIPTION OF THE PREFERRED EMBODIMENT

Overall Embodiment

Figure 1:
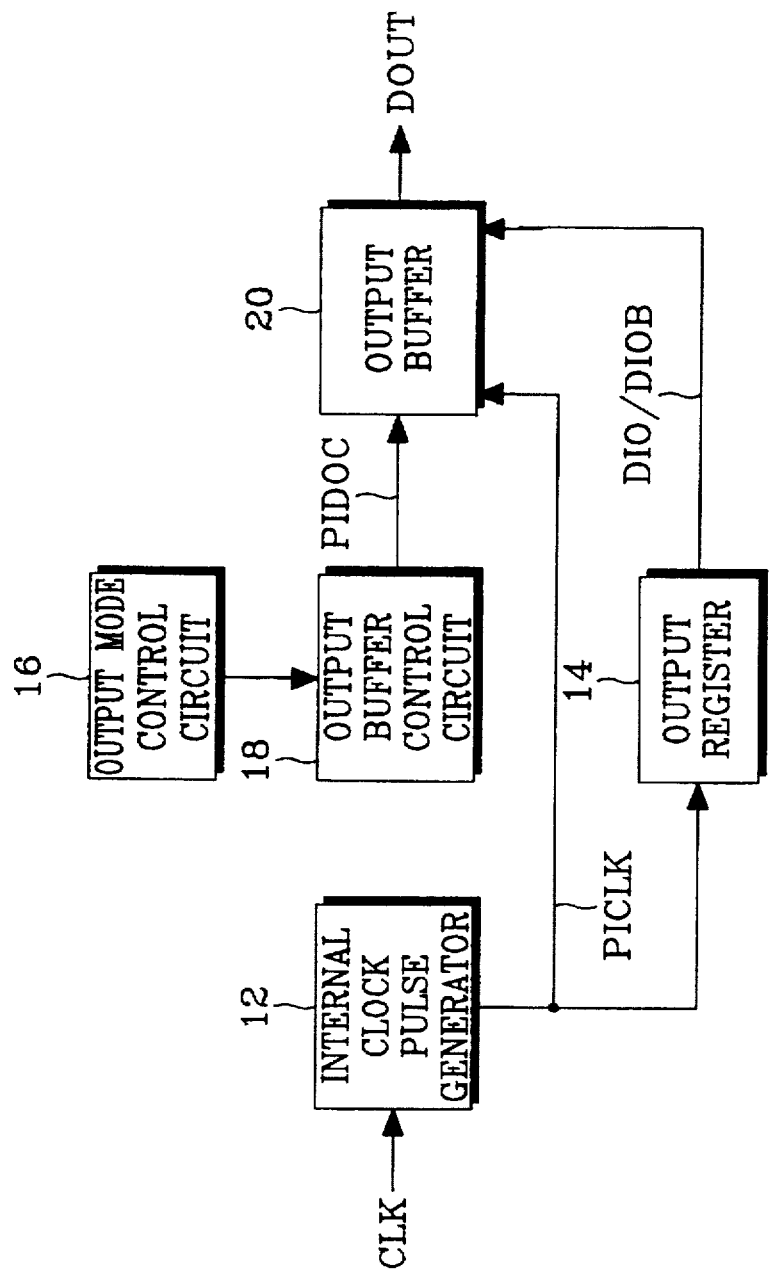
FIG. 1 is a block diagram illustrating the data output buffer control apparatus of the conventional prior art semiconductor memory device.
Figure 2:
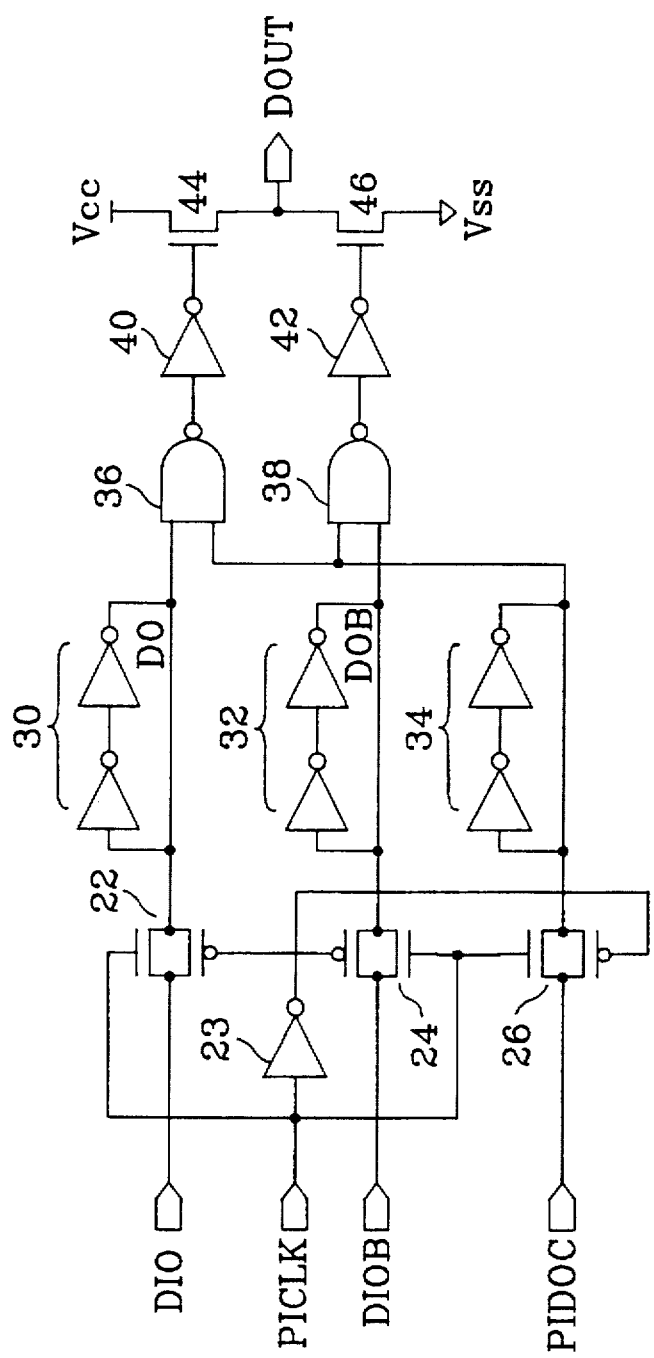
FIG. 2 is a detailed schematic diagram illustrating the data output buffer control apparatus of the prior art semiconductor memory device shown in FIG. 1.
Figure 3:
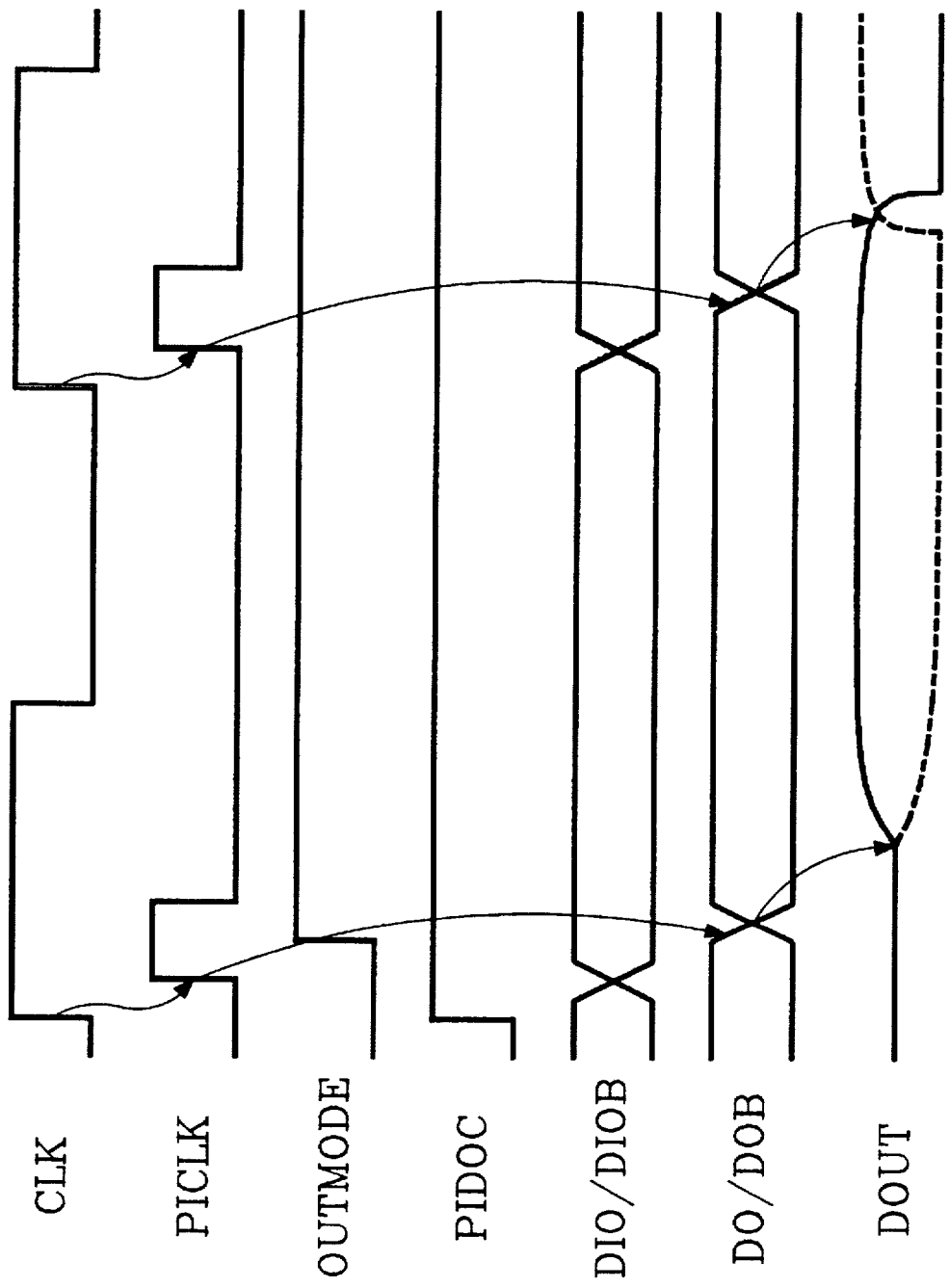
FIG. 3 is a timing chart explaining the operation of the data output buffer control apparatus of the prior art depicted in FIGS. 1 and 2.
Figure 4:
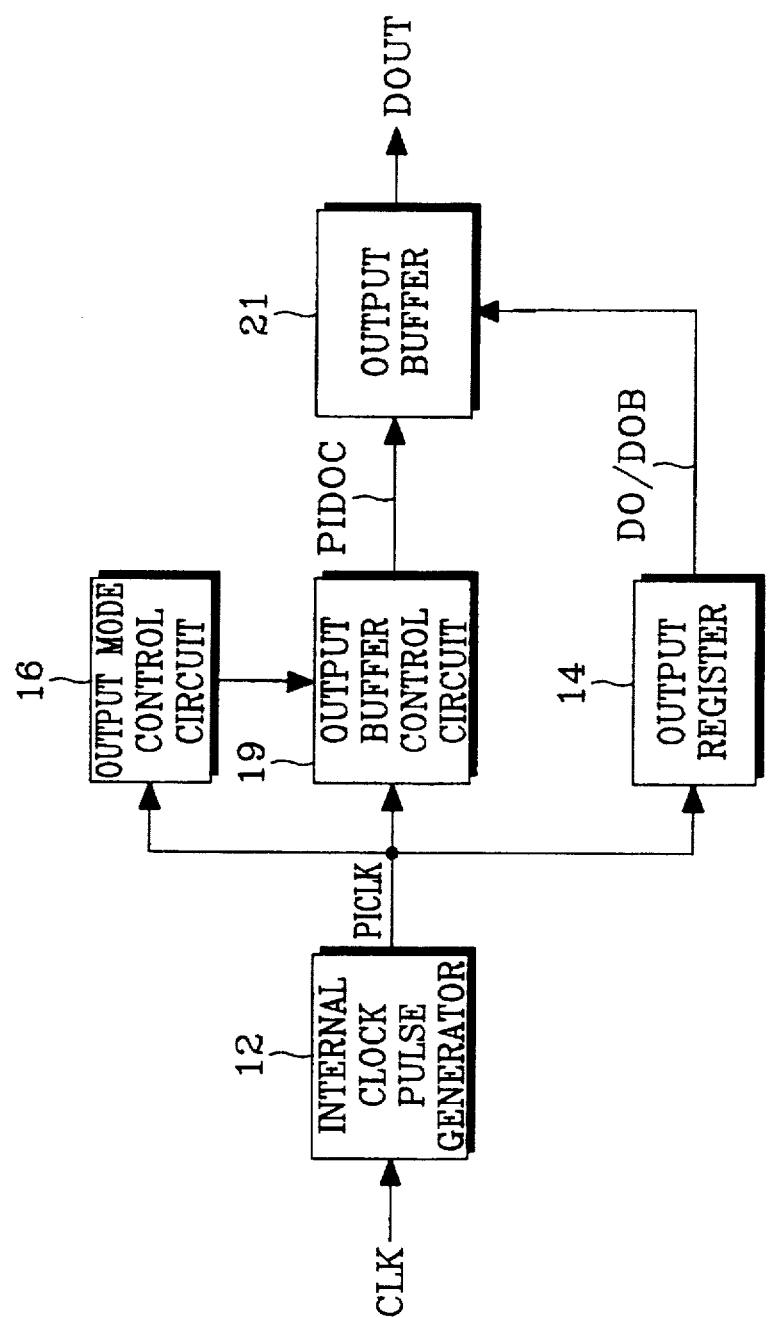
FIG. 4 is a block diagram illustrating the data output buffer control apparatus of the semiconductor memory device according to the present invention.

Referring to FIG. 4, the constitution of the data output buffer control apparatus of the semiconductor memory device, according to the present invention, is such that it transmits data in high speed in response to the externally supplied system clock CLK. Particularly, the output buffer control circuit (shown schematically in FIG. 5) detects a first edge, i.e. the high going edge, of the internal clock pulse PICLK transmitted from the internal clock generator 12 and generates an output control pulse OUT52 (see FIG. 5), which is gated to transmit the output mode control signal OUTMODE, delivered from the output mode control circuit 16, in response to the output control pulse. Namely, the output buffer control circuit is gated so as to transmit the output mode control signal OUTMODE from the second edge of the internal clock pulse PICLK, i.e. the falling edge to the first edge, i.e. the rising edge (see FIG. 7). The data output buffer 21 uses the output control signal PIDOC from the output buffer control circuit 19 (see FIG. 5) to control the data on the data output line pair DIO/DIOB, of the output register 14, and buffers the data signals DIO/DIOB to produce the buffered output data DOUT which is sent to the output terminal.

Figure 7:
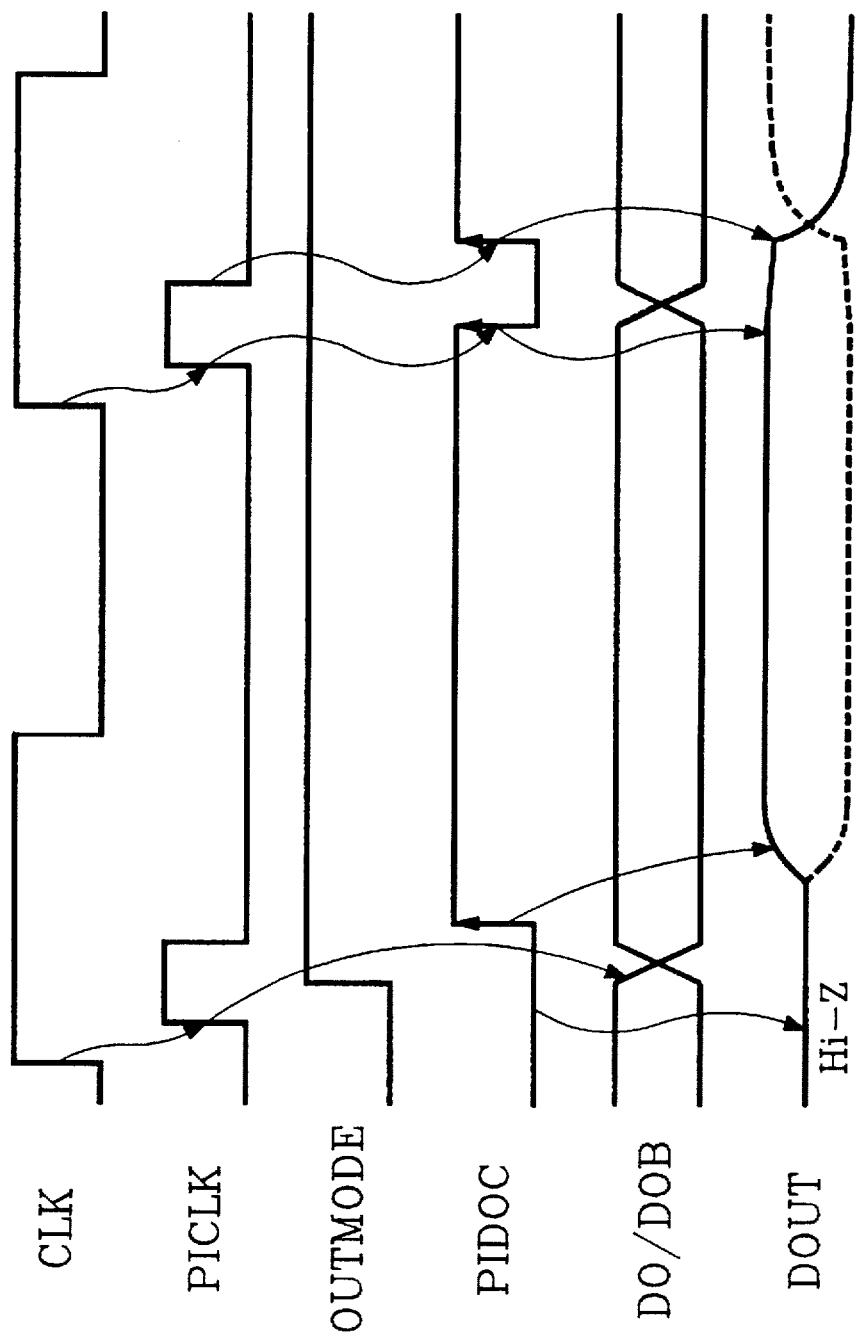
FIG. 7 is an timing chart explaining the operation of the data output buffer control apparatus of FIG. 4.

When the externally supplied system clock CLK is applied to the data output buffer control apparatus, the internal clock generator 12 detects the rising edge, and generates an internal clock pulse PICLK having a specified duration (see FIG. 7). The internal clock pulse PICLK is then transferred to the output register 14, to the output mode control circuit 16, and to the output buffer control circuit 19. In this case, an automatic pulse generator used in the synchronous semiconductor memory device can be employed for the internal clock generator 12. The output register 14 synchronizes with the clock pulse PICLK, thereby transmitting the data stored therein to the data output line pair DO/DOB. The output mode control circuit 16 synchronizes with the first edge, i.e. rising edge, of the internal clock pulse PICLK, thereby transmitting the preset output mode control signal OUTMODE to the output buffer control circuit 19. The output buffer control circuit 19 is coupled to the output node of the output mode control circuit 16 as well as the output node of the internal clock generator 12. The output buffer control circuit 19 gates the output mode control signal OUTMODE during the cycle of the rising edge of the internal clock pulse PICLK and the rising edge of next internal clock pulse, transmitting the output mode control signal OUTMODE as an output control signal PIDOC. The output buffer 20 gates the output control signal PIDOC with the data line pair DO/DOB to create a buffered output signal DOUT.

Output Buffer Control Circuit

Figure 5:
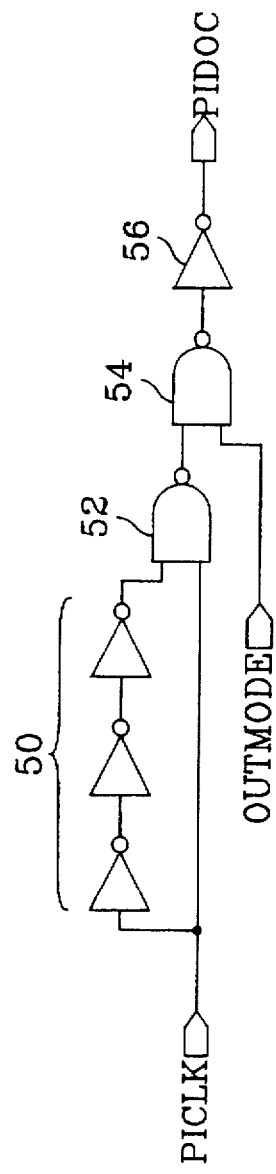
FIG. 5 is a detailed circuit diagram of the output buffer control circuit of the data output buffer control apparatus of the present invention of FIG. 4 (detail 19)
Figure 8:
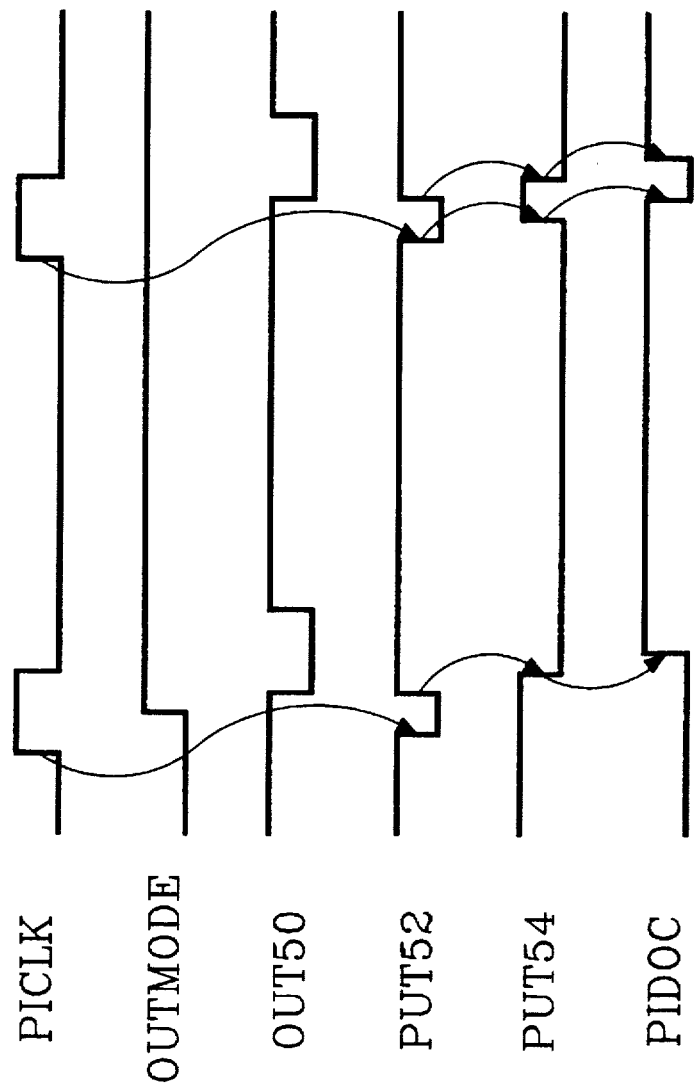
FIG. 8 is a timing chart illustrating the operation of the output buffer control circuit of FIG. 5.

Referring to FIGS. 5 and 8, the operation of the output buffer control circuit 19 (see FIG. 4) is explained as follows: The internal clock pulse PICLK is supplied to the output buffer control circuit at the input node of a reverse delaying device 50, consisting of an odd number of inverters, and simultaneously applied to the first node of the NAND gate 52. The reverse delaying device 50 delays and reverses the internal clock pulse PICLK and transmits the resulting signal OUT50 to the second input node of the NAND gate 52. Accordingly, when the internal clock pulse PICLK is applied continuously, the NAND gate 52 is triggered by every rising edge of the internal clock pulse PICLK, thereby generating the "LOW" pulse OUT52 having a duration corresponding to the delay time of the reverse delaying device 50. If, at that time, the output mode control signal OUTMODE, synchronized with the internal clock pulse PICLK, is in the state enabled to "HIGH", then the output control signal PIDOC is transmitted by the operation of the NAND gate 54 and the inverter 56. That is, the output mode control signal OUTMODE, when enabled, is changed to a pulse type signal PIDOC, which is disabled to logically "LOW" state for a specified time by detecting and controlling the rising edge of the internal clock pulse PICLK. Namely, the output control signal PIDOC is disabled when the internal clock pulse PICLK becomes a rising edge, but is enabled when the internal clock pulse PICLK becomes a falling edge.

Output Buffer

Figure 6:
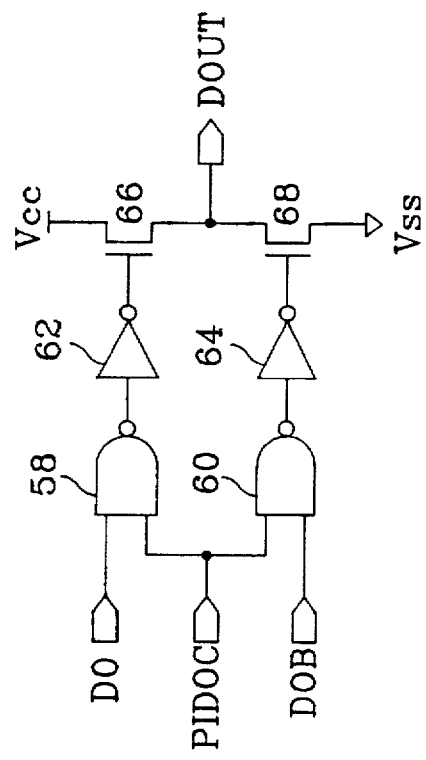
FIG. 6 is a detailed circuit diagram illustrating the data output buffer of the data output control apparatus depicted in FIG. 4 (detail 21)

As mentioned above, the output control signal PIDOC, controlled by the internal clock pulse PICLK, is supplied to the output buffer 21 (see FIG. 4). Referring to FIGS. 6 and 7, when the initial output of the output control signal PIDOC is disabled to "LOW", the level of the output terminal DOUT is transmitted in the form of high impedance "Hi-Z." This results because the NAND gates 58 and 60 within the data output buffer are each in the logically "HIGH" state. Passing through inverters 62 and 64, respectively, both signals become logically "LOW" and the pull-up and pull-down NMOS transistors 66 and 68, having their respective gates coupled to the output nodes of the inverters 62 and 64, are, therefore, both turned off. Under this situation, when the data and complementary data signals, passed through the data output line pair DO/DOB by the internal clock pulse PICLK, are delivered to the second input nodes of the NAND gates 58 and 60, respectively, and the internal clock pulse PICLK transits to the falling edge; then the output control signal PIDOC is enabled to a logically "HIGH" state, whereby the pull-up and pull-down NMOS transistors 66 and 68, coupled between the power source voltage Vcc and the grounding voltage Vss, are driven by the level of the data on the data output line pair DO/DOB, thereby transmitting data to the output terminal DOUT.

When the pull-up and pull-down NMOS transistors 66 and 68 are operated as above, they transmit data. When the internal clock pulse PICLK transits to "HIGH", the output control signal PIDOC transits again to "LOW", thereby resulting in the output terminal DOUT of the data output buffer being transited in high speed, and the data being transmitted in high speed. Accordingly, the data output buffer control apparatus composed as aforementioned enables high speed data transmission, whereby after putting the initial output into the state of logically high impedance, the pull-up and pull-down NMOS transistors are driven by the output control signal PIDOC synchronized with the data on the data line pair DO/DOB and the internal clock pulse PICLK.

Other Embodiments

Figure 9:
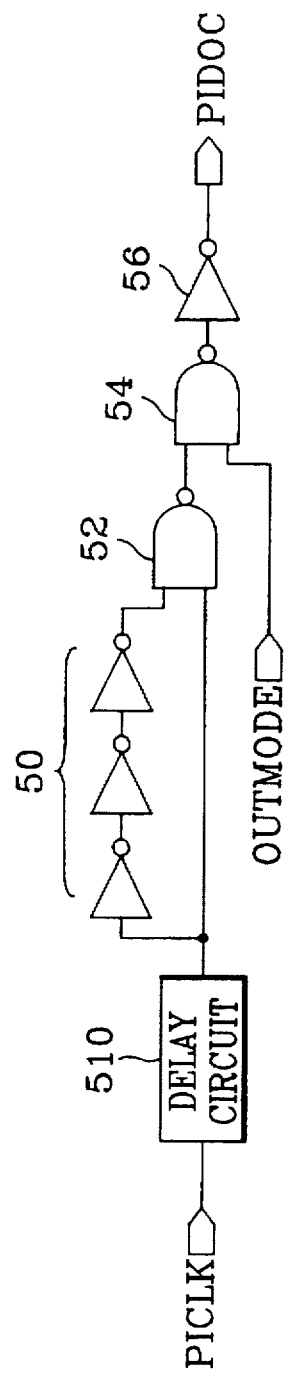
FIG. 9 is a block circuit diagram illustrating another embodiment of the output buffer control circuit of the data output buffer control apparatus of FIG. 4 (detail 19) according to the present invention.

FIG. 9 illustrates another potential embodiment of the data output buffer control apparatus according to the present invention. In this embodiment, the output buffer control circuit (similar to FIG. 5) is configured with a delay circuit 70, in addition to reverse delay circuit 50, the delay circuit 70 being coupled to the input node of the internal clock pulse PICLK to delay the clock input. Delay circuit 70 thereby also delays the output of the output control signal PIDOC by delaying the input of the internal clock pulse PICLK. By delaying the output of the output control signal PIDOC, the enable and disable time of the data output buffer 21 can be easily controlled.

As mentioned above, the present invention has the advantages that the data transmission can be performed in high speed and also that the enable and disable time of the data output buffer can be easily controlled.

Having described and illustrated the principles of the invention in a preferred embodiment and other potential embodiments thereof, it should be apparent that the invention can be modified in arrangement and detail by those skilled in the art without departing from such principles. We, therefore, claim all modifications and variations coming within the spirit and scope of the following claims.

What is claimed is:

1. A data output buffer control apparatus of a synchronous semiconductor memory device for retrieving data from an inside of a chip in synchronism with a system clock pulse, the system clock pulse being externally applied and having an edge, the data output buffer control apparatus comprising:

an internal clock pulse generator for generating an internal clock pulse in response to the edge of the system clock pulse, the internal clock pulse having an edge;

an output register for transmitting a data output from the inside of the chip to a plurality of data output lines in synchronism with the edge of the system clock pulse;

an output mode control signal generator for generating a predetermined output mode control signal in synchronism with said system clock pulse;

an output buffer control means for gating said output mode control signal from the edge of said internal clock pulse to an edge of a subsequent internal clock pulse, thereby producing an output control signal; and a data output means for driving the data output of said output register in response to the output control signal of said output buffer control means.

2. A data output buffer control apparatus as defined in claim 1, wherein said output buffer control means further comprises a pulse generator for generating a control pulse with a given width, having a first and second edge, by detecting the edge of said system clock pulse, and a means for logically combining said control pulse and output mode control signal to generate said output control signal during the interval between the second edge and the first edge of said control pulse.

3. A data output buffer control apparatus as defined in claim 1, wherein said data output means comprises:

a data driver consisting of a pull-up and a pull-down transistor, each transistor having a gate;

each transistor being connected between a source voltage and an output node for pulling up or down said output node in response to a respective pull-up or pull-down signal;

a means for turning off said pull-up and pull-down transistor in response to deactivation of the output control signal of said output buffer control means; and said data output means being enabled by activation of said output control signal to supply the data and complementary data of said data output lines to the gates of said pull-up and pull-down transistors.

4. A data output buffer control apparatus of a semiconductor memory device for transferring a data output from an inside of a chip, synchronized with a system clock pulse, the system clock pulse being externally applied and having an edge, the data output buffer control apparatus comprising:

a clock pulse generator for generating an internal clock pulse in response to the edge of said system clock pulse, the internal clock pulse having a given width and a first edge;

an output register for transferring the data output of the chip to a plurality of data output lines in response to said internal clock pulse;

an output mode control signal generator for generating an output mode control signal in synchronism with said internal clock pulse;

an output buffer control means for gating said output mode control signal from the first edge of said internal clock pulse to a first edge of a subsequent internal clock pulse to produce an output control signal; and a data output means for driving the data output of said output register in response to the output control signal delivered from said output buffer control means.

5. A data output buffer control apparatus as defined in claim 4, wherein said output buffer control means comprises:

a pulse generator for generating a control pulse by detecting the first edge of said internal clock pulse, the control pulse having a given width, a first edge, and a second edge; and a means for logically combining said control pulse and the output mode control signal to generate said output control signal of the output buffer control means in the interval between the first and second edge of said control pulse.

6. A data output buffer control apparatus according to claim 4, wherein said output buffer control means is provided with a means for delaying an input of said internal clock pulse into the buffer control means for a given time.

7. A data output buffer control apparatus as defined in claim 4, wherein said data output means comprises:

a data driver consisting of a pull-up and a pull-down transistor, each transistor having a gate;

each transistor connected between a source voltage and an output node for pulling up or down said output node in response to a pull-up or pull-down signal, respectively;

a means for turning off said pull-up and pull-down transistor in response to deactivation of the output control signal of said output buffer control means; and said data output means being enabled by activation of said output control signal of the output buffer control means to supply the data and complementary data of said data output lines to the gates of said pull-up and pull-down transistor.

8. A method for data output buffer control of a synchronous semiconductor memory device comprising the steps of:

generating an internal clock pulse in response to an external system clock, the internal clock pulse having a first edge;

transferring data from a chip to a pair of data output lines in response to the internal clock pulse;

generating an output mode control signal in synchronism with the internal clock pulse;

gating the output mode control signal from the first edge of the internal clock pulse to the first edge of the next internal clock pulse to produce an output control signal; and driving output to an output pad in response to the output control signal.

* * * * *

UNITED STATES PATENT AND TRADEMARK OFFICE
CERTIFICATE OF CORRECTION

PATENT NO. : 5,798,969
DATED : August 25, 1998
INVENTOR(S) : Yoo et al.

It is certified that error appears in the above-identified patent and that said Letters Patent is hereby corrected as shown below:

Every occurrence throughout the patent, "FIG." should read -- fig. --;

Column 1,
Line 62, "trasistor" should read -- transistor --;

Every occurrence throughout the patent, "claim" should read -- Claim --.

Signed and Sealed this

Fourth Day of December, 2001

*Attest:*

NICHOLAS P. GODICI
*Attesting Officer*     *Acting Director of the United States Patent and Trademark Office*